(12) United States Patent
Yamawaki

(10) Patent No.: US 6,852,551 B2
(45) Date of Patent: Feb. 8, 2005

(54) METHOD OF FORMING A FERROELECTRIC FILM AND FABRICATION PROCESS OF A SEMICONDUCTOR DEVICE HAVING A FERROELECTRIC FILM

(75) Inventor: Hideki Yamawaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/767,178

(22) Filed: Jan. 30, 2004

(65) Prior Publication Data
US 2004/0182313 A1 Sep. 23, 2004

Related U.S. Application Data

(62) Division of application No. 10/338,647, filed on Jan. 9, 2003, now Pat. No. 6,790,677.

(30) Foreign Application Priority Data
Mar. 1, 2002 (JP) .................................... 2002-056146

(51) Int. Cl.$^7$ .................... H01L 21/00; H01L 21/8242; B05C 11/00
(52) U.S. Cl. .................. 438/3; 438/5; 438/7; 438/635; 438/253; 438/396; 118/665; 118/667; 118/712; 118/58
(58) Field of Search .................. 438/3, 5, 7, 635, 438/253, 396; 118/665, 667, 712, 58

(56) References Cited

U.S. PATENT DOCUMENTS

| | | | |
|---|---|---|---|
| 4,812,300 A | 3/1989 | Quinlan et al. ............. 423/404 |
| 4,891,246 A * | 1/1990 | McEwen et al. ............ 427/97.5 |
| 4,916,033 A * | 4/1990 | Gourdine ...................... 429/49 |
| 6,090,701 A * | 7/2000 | Hasunuma et al. .......... 438/632 |
| 6,177,361 B1 | 1/2001 | Gilton ......................... 438/785 |
| 6,204,069 B1 | 3/2001 | Summerfelt et al. ........... 438/3 |
| 6,235,402 B1 | 5/2001 | Shoup et al. ................ 428/472 |
| 6,323,115 B1 * | 11/2001 | Tanabe et al. .............. 438/592 |
| 6,495,412 B1 | 12/2002 | Zhu et al. ................... 438/240 |
| 6,500,678 B1 | 12/2002 | Aggarwal et al. ............. 438/3 |
| 6,524,867 B2 | 2/2003 | Yang et al. ..................... 438/3 |
| 6,589,839 B1 | 7/2003 | Basceri et al. .............. 438/254 |
| 6,703,277 B1 * | 3/2004 | Paton et al. ................ 438/287 |
| 6,784,038 B2 * | 8/2004 | Tanabe et al. .............. 438/199 |
| 6,790,677 B2 * | 9/2004 | Yamawaki ..................... 438/3 |
| 2003/0113986 A1 | 6/2003 | Sakamoto et al. .......... 438/584 |

FOREIGN PATENT DOCUMENTS

JP 11-142395 5/1999
JP 2000-307077 11/2000

* cited by examiner

Primary Examiner—John F. Niebling
Assistant Examiner—Jennifer M. Kennedy
(74) Attorney, Agent, or Firm—Westerman, Hattori, Daniels & Adrian, LLP

(57) ABSTRACT

A method of forming a ferroelectric film includes the steps of forming a layer by a material that takes a metal state in a reducing ambient and an oxide state in an oxidizing ambient, and depositing a ferroelectric film on a surface of the layer by supplying gaseous sources of the ferroelectric film and an oxidizing gas and causing a decomposition of the gaseous sources at the surface of said layer, wherein the step of depositing the ferroelectric film is started with a preparation step in which the state of the surface of said layer is controlled substantially to a critical point in which the layer changes from the metal state to the oxide state and from the oxide state to the metal state.

3 Claims, 13 Drawing Sheets

2θ (degrees)

METHOD OF FORMING A FERROELECTRIC FILM AND FABRICATION PROCESS OF A SEMICONDUCTOR DEVICE HAVING A FERROELECTRIC FILM

This application is a divisional application of prior application Ser. No. 10/338,647 filed Jan. 9, 2003 now U.S. Pat. No. 6,790,677.

CROSS-REFERENCE TO RELATED APPLICATION

The present application is based on Japanese priority application No. 2002-056146 filed on Mar. 1, 2002, the entire contents of which are hereby incorporated by reference.

BACKGROUND OF THE INVENTION

The present invention generally relates to semiconductor devices and more particularly to the method of forming a ferroelectric film and fabrication process of a semiconductor device having a ferroelectric film.

A ferroelectric random access memory (FRAM) is a semiconductor device that has a ferroelectric capacitor. A ferroelectric capacitor is a capacitor having a ferroelectric film sandwiched by a pair of capacitor electrodes, and a ferroelectric random access memory stores information in the ferroelectric capacitor insulation film in the form of spontaneous polarization. Thus, an ferroelectric random access memory functions as a non-volatile memory device.

In view of the fact that reversal of spontaneous polarization can be caused in a ferroelectric capacitor insulation film by mere application of a reversing electric field thereto without injection of a current, a ferroelectric random access memory can be written with information (reversal of spontaneous polarization) with minimum electric power. Further, such reversal of the spontaneous polarization can be conducted with very high speed.

Typically, a ferroelectric capacitor for use in a ferroelectric random access memory uses a layer of a perovskite ferroelectric material such as PZT ($Pb(Zr,Ti)O_3$), SBT ($SrBi_2Ta_2O_9$), and the like, for the ferroelectric capacitor insulation film, and the ferroelectric capacitor insulation film is formed on a lower electrode formed of a material such as Pt (platinum). The lower electrode, in turn, is connected to a conductive region of a transistor by way of a conductive plug such as W (tungsten) provided in an interlayer insulation film.

In order that the ferroelectric film undergoes the desired reversal of polarization with minimum drive voltage, it is necessary that the crystal grains in the ferroelectric film are aligned in a predetermined crystal orientation. Typically, a crystal orientation of <111> or <001> is used in the case of a PZT film, wherein the crystal orientation of <001> is most preferable in view of the maximum electric performance of the film.

On the other hand, there is a possibility in such a conventional construction that the tungsten plug or platinum lower electrode undergoes oxidation at the time of formation of the ferroelectric capacitor insulation film because of the oxidizing ambient that is used at the time of formation of the ferroelectric film.

In view of the problems noted above, the inventor of the present invention has proposed the use of Ir (iridium) for the material of the electrode of the ferroelectric capacitor used in a ferroelectric random access memory. In the case of using iridium, the problem of increase of resistance at the lower capacitor electrode caused by oxidation of the lower capacitor electrode is minimized because of the fact that iridium oxide.

When using iridium for the lower electrode film, it is preferable to form the ferroelectric film by way of an MOCVD process in view of the controllability of the ferroelectric composition and in view of feasibility of mass production.

At the time of forming a ferroelectric film by way of an MOCVD process, it is necessary to cause a decomposition of metal organic source materials of the ferroelectric film in a reactor such that deposition of a ferroelectric film takes place on the iridium substrate, wherein it should be noted that such a decomposition process requires oxygen.

On the other hand, oxygen thus introduced into a reactor, while causing the necessary decomposition of the metal organic source materials of the ferroelectric film, causes also an unwanted oxidizing reaction on the surface of the iridium film, on which the deposition of the ferroelectric film takes place. As a result of such an oxidizing reaction, the surface of the iridium lower electrode is converted to iridium oxide ($IrO_2$).

When the surface of the iridium lower electrode is completely oxidized and there is formed a film of iridium oxide covering the surface of the Ir electrode, the crystal grains of the ferroelectric film thus grown on the iridium oxide film take various crystal orientations, and the desired <001> orientation is no longer obtained. Thereby, problems such as increase of drive voltage at the time of writing or erasing of information are caused associated with the degradation of the electric performance of the ferroelectric film, which in turn is caused by the uncontrolled alignment of orientation of the crystal grains in the ferroelectric film.

Further, it has been difficult to control the progress of the oxidization reaction of the iridium lower electrode and it has been difficult to control the timing of ferroelectric film formation such that the formation of the ferroelectric film is started before there is caused substantial oxidation in the iridium lower electrode.

SUMMARY OF THE INVENTION

Accordingly, it is a general object of the present invention to provide a novel and useful method of forming a ferroelectric film and fabrication process of a semiconductor device having a ferroelectric film wherein the foregoing problems are eliminated.

Another object of the present invention is to provide a method of forming a ferroelectric film while controlling the atmosphere of the ferroelectric film formation at a critical point of oxidation-reduction reaction.

Another object of the present invention is to provide a method of forming a ferroelectric film, comprising the steps of:

forming a layer by a material that takes a metal state in a reducing ambient and an oxide state in an oxidizing ambient; and depositing a ferroelectric film on a surface of said layer by supplying gaseous sources of said ferroelectric film and an oxygen gas and causing a decomposition of said gaseous sources at said surface of said layer, said step of depositing said ferroelectric film being started with a preparation step in which the state of said surface of said layer is controlled substantially to a critical point in which the state of said layer changes from said metal state to said oxide state and from said oxide state to said metal state.

Another object of the present invention is to provide a method of fabricating a semiconductor device, comprising the steps of:

forming an active element on a substrate;

forming a lower electrode over said substrate in electrical connection with said active element, said step of forming said lower electrode being conducted by using a material that takes a metal state in a reducing ambient and an oxide state in an oxidizing ambient for said lower electrode;

depositing a ferroelectric film on a surface of said lower electrode by supplying gaseous sources of said ferroelectric film and an oxygen gas and by causing a decomposition of said gaseous sources at said surface of said lower electrode; and depositing an upper electrode on said ferroelectric film, said step of depositing said ferroelectric film being started with a preparation step in which the state of said surface of said lower electrode is controlled substantially to a critical point in which a state of said lower electrode changes from said metal state to said oxide state and from said oxide state to said metal state.

According to the present invention, the surface of the layer is only partially covered by an oxide film such that the crystal structure of the material forming the layer is exposed at the time of starting the deposition of the ferroelectric film as a result of the preparation step. Alternatively, the surface of the layer is covered with an extremely thin oxide film such as the one having the thickness of several atomic layers of oxygen or less, at the time of starting the deposition of the ferroelectric film by a CVD process. As a result, the ferroelectric film deposited on the layer inherits the crystal orientation of the layer in the metallic state even when the deposition of the ferroelectric film is conducted under the existence of the oxygen gas, and the ferroelectric film thus grown shows excellent electric performance.

In a preferred embodiment, a preparation step is conducted after the formation of the layer but before the start of deposition of the ferroelectric film, by processing the surface of the layer by an organic solvent. Thereby, layer causes a catalytic action enhancing the reducing power of the organic solvent, and the surface state of the layer is effectively biased to the reducing side at the time the deposition of the ferroelectric film is started and the oxygen gas is supplied together with other various metal organic gaseous sources, and there appears an equilibrium state in which the reducing reaction and the oxidizing reaction are equilibrated. Once the growth of the ferroelectric film thus is started with the predetermined desired crystal orientation determined with the crystal orientation of the layer, the crystals in the ferroelectric film grow in conformity with the ferroelectric crystal grains at the interface to the layer, and the entire ferroelectric film is grown in the desired crystal orientation.

Another object of the present invention is to provide a method of realizing a critical state of oxidation-reduction reaction on a surface of a layer.

Another object of the present invention is to provide a method of realizing a critical state of oxidation-reduction reaction on the surface of a layer that takes a metal state in a reducing ambient and an oxide state in an oxidizing ambient and shows a catalytic action in the metal state, comprising the steps of:

introducing said layer into a process space;

supplying an oxidizing gas and a vapor of an organic solvent into said process space; and causing an oxidizing reaction and a reducing reaction on said surface of said layer in said process space, said oxidizing gas and said vapor being supplied into said process space with a proportion set such that there is caused an equilibrium between said oxidizing gas and said vapor on said surface of said layer.

Another object of the present invention is to provide a method of determining the state of an oxidation-reduction reaction taking place on a layer of a material that takes a metal state in a reducing ambient and an oxide state in an oxidizing ambient, said material showing a catalytic action in said metal state, said method comprising the steps of:

introducing said layer into a process space;

supplying an oxidizing gas and a vapor of an organic solvent into said process space;

causing an oxidizing reaction and a reducing reaction on said surface of said layer in said process space;

examining a state of said surface of said layer; and determining a ratio of said oxidizing gas and said reducing gas that provides an equilibrium condition in which an oxidizing reaction and a reducing reaction equilibrate.

Another object of the present invention is to provide an apparatus for forming a ferroelectric film, comprising:

a reactor evacuated by a pump;

a stage provided in said reactor for holding a substrate;

a first source supplying an oxidizing gas to said reactor;

a second source supplying a reducing gas to said reactor;

a third source supplying a gaseous source material of said ferroelectric film to said reactor;

a detector detecting an oxide film formed on said substrate on said stage; and a controller controlling said first through third sources, said controller controlling said first and second sources in response to an output of said detector such that there is realized a critical state of oxidation-reduction reaction taking place on a surface of said substrate.

According to the present invention, it becomes possible to determine the specific ratio of the oxidizing gas and the reducing gas in order to achieve the critical condition of the oxidation-reduction reaction taking place on the surface of the layer. By using such a critical condition, it becomes possible to realize the critical condition at the time of depositing a ferroelectric film on the layer to form a ferroelectric capacitor.

Other objects and further features of the present invention will become apparent from the following detailed description when read in conjunction with the attached drawings.

DETAILED DESCRIPTION OF THE INVENTION

First Embodiment

Figure 1:
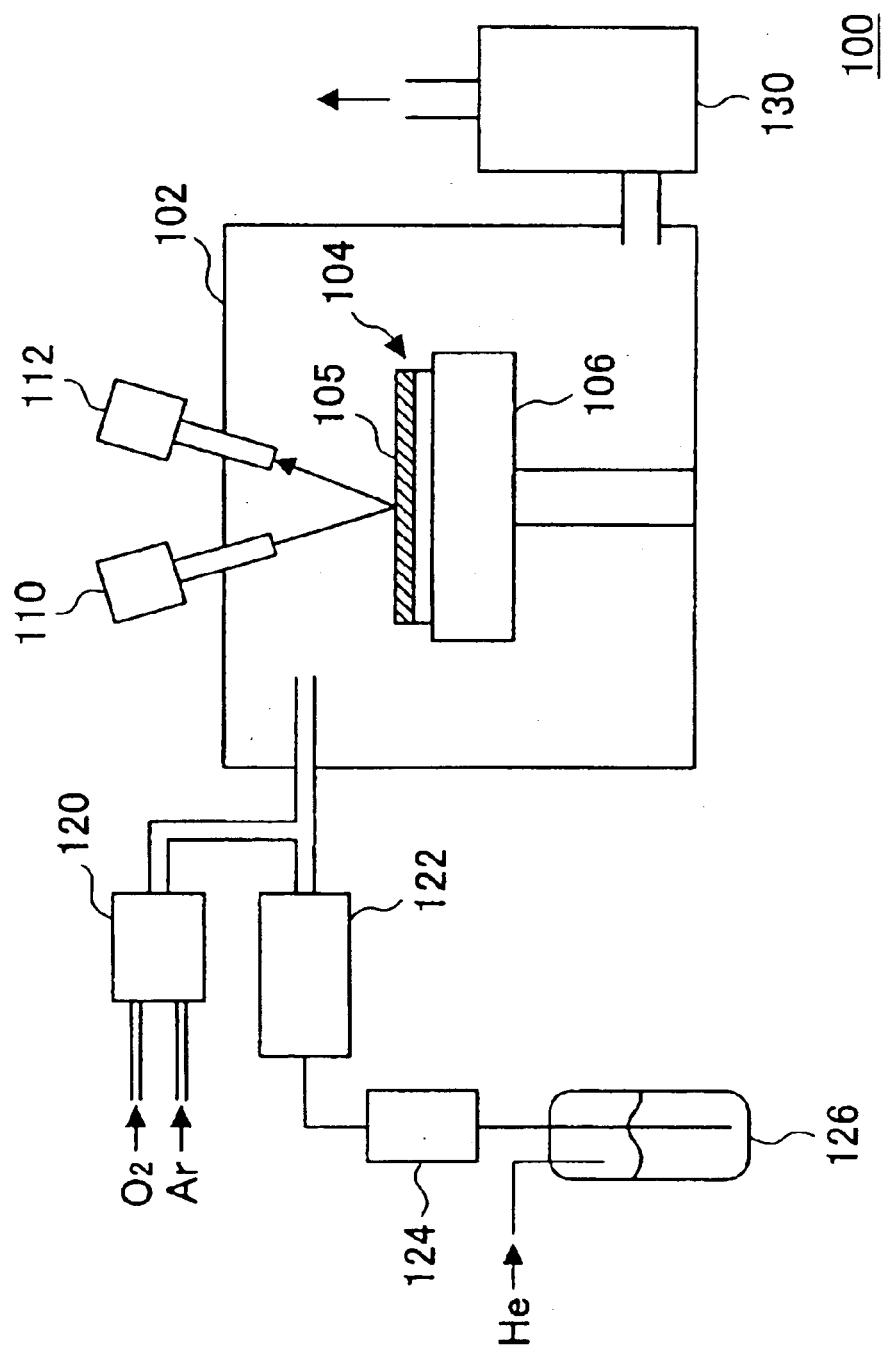
FIG. 1 is a diagram showing the construction of an apparatus used for evaluating the critical condition of oxidation-reduction reaction taking place on the surface of an iridium film according to a first embodiment of the present invention.

FIG. 1 shows the construction of an examination apparatus 100 used for evaluating the critical point of oxidation-reduction reaction taking place on the surface of a metal film such as the one used for the lower electrode of a ferroelectric capacitor in the experiment conducted by the inventor.

Referring to FIG. 1, the apparatus 100 includes a reactor 102 evacuated by a pump,130, and, the reactor 102 accommodates therein a stage 106 holding a sample 104, wherein the stage 106 includes a heater for heating the sample 104 to a predetermined substrate temperature. The sample 104 used in the experiment carries an iridium film 105 formed on a silicon substrate. As will be noted below, the surface of the iridium film takes the state of metal iridium or iridium oxide depending on the oxygen concentration in the process ambient used for processing the sample 104.

Further, the apparatus 100 includes an X-ray source 110 irradiating the sample 104 with X-ray and a detector 112 detecting the diffraction of the X-ray caused by the sample 104.

The apparatus 100 further includes a bottle 126 of an organic solvent, which may be THF (tetrahydrofuran) or butyl acetate ($C_6H_{12}O_2$), wherein the organic solvent in the bottle 126 is supplied to the reactor 102 with a predetermined flow rate such as 0.5 milliliters per minute via a liquid mass-flow controller 124. Thereby, the organic solvent is supplied to the reactor 102 in the form of an organic vapor after being vaporized in a vaporizer 122. It should be noted that the vaporizer 122 has an inner wall temperature of 200–250° C. and causes evaporation in the liquid organic solvent injected thereto from the liquid mass-flow controller 124.

The vaporized organic solvent is then supplied to the reactor 102 together with an oxygen gas and an argon gas supplied to the reactor 102 via a gas mass-flow controller 120.

It should be noted that a helium gas is used for pressurizing the liquid organic solvent in the bottle 126 such that the liquid organic solvent is transported to the vaporizer 122.

Next, the experiments conducted by the inventor of the present invention and constitute the foundation of the present invention will be explained.

In the experiment, a silicon substrate carrying a silicon dioxide ($SiO_2$) film is used for the sample 104 and an iridium film 105 is formed on the silicon dioxide film by a sputtering process with a thickness of about 200 nm.

The sample 104 thus prepared is introduced into the reactor 102 and is placed on the heating stage 106.

The sample thus placed on the stage 106 is then heated to a predetermined temperature such as 500–600° C. while evacuating the interior of the reactor 102 to a predetermined pressure of about 10 Torr. The foregoing temperature of 500–600° C. was chosen in view of the purpose of the experiment to investigate the oxidation-reduction reaction taking place on the surface of an iridium electrode at the time of depositing a ferroelectric film such as a PZT film on the iridium electrode during the fabrication process of a ferroelectric random access memory device.

Next, an oxygen ($O_2$) gas and an argon (Ar) gas are introduced into the reactor 102 with a predetermined mixing ratio. In the experiment, the mixing ratio was set to 15% or 30%, and an oxygen/argon gas mixture is supplied to the reactor 102 with a flow rate of 2.8 liter/minute. Here, it should be noted that the mixing ratio is define das the ratio of oxygen to argon in the foregoing oxygen/argon gas mixture. The gas mixture thus supplied to the reactor 102 contains oxygen and functions as an oxidizing agent or oxidizing gas.

Further, the organic solvent 126 such as THF or butyl acetate is supplied to the vaporizer 122 from the liquid mass-flow controller 124 to the vaporizer 122 with a predetermined rate such as 0.5 milliliter per minute, and as a result, the vapor of the organic solvent is introduced also into the reactor 102, wherein the vapor of the organic solvent thus introduced functions as a reducing agent or reducing gas on the iridium oxide film 105 formed on the surface of the sample 104.

In the present experiment, attempt was made to control the oxidation-reduction reaction taking place on the surface of the iridium film 105 formed on the surface of the sample 104 in view of the prospect of holding the surface of the iridium oxide film 105 at a critical point of the oxidation-reduction reaction, in which the oxidation reaction and the reduction reaction are equilibrated, by way of controlling the ratio of the oxidizing gas and the reducing gas appropriately.

Thus, the inventor has examined the surface state of the iridium oxide film 105 each time a new sample 104 is processed in the reactor 102 for a predetermined interval under various conditions in which the concentration of oxygen in the process ambient of the reactor 102 is changed variously. Here, the examination of the surface state was conducted by irradiating the surface of the iridium oxide film 105 with X-ray produced by the X-ray source 110 and by detecting the X-ray diffraction pattern by using the detector 112.

It should be noted that the apparatus 100 of FIG. 1 provides also the possibility of in-situ measurement of the surface state of the iridium oxide film 105. In this case, it is possible to monitor the progress of the oxidation reaction or the reducing reaction that is taking place on the surface of the iridium oxide film 105 and it becomes also possible to investigate the effect of the MOCVD source gas used for depositing a ferroelectric film on the oxidation-reduction reaction taking place on the surface of the iridium oxide film 105.

Figure 2:
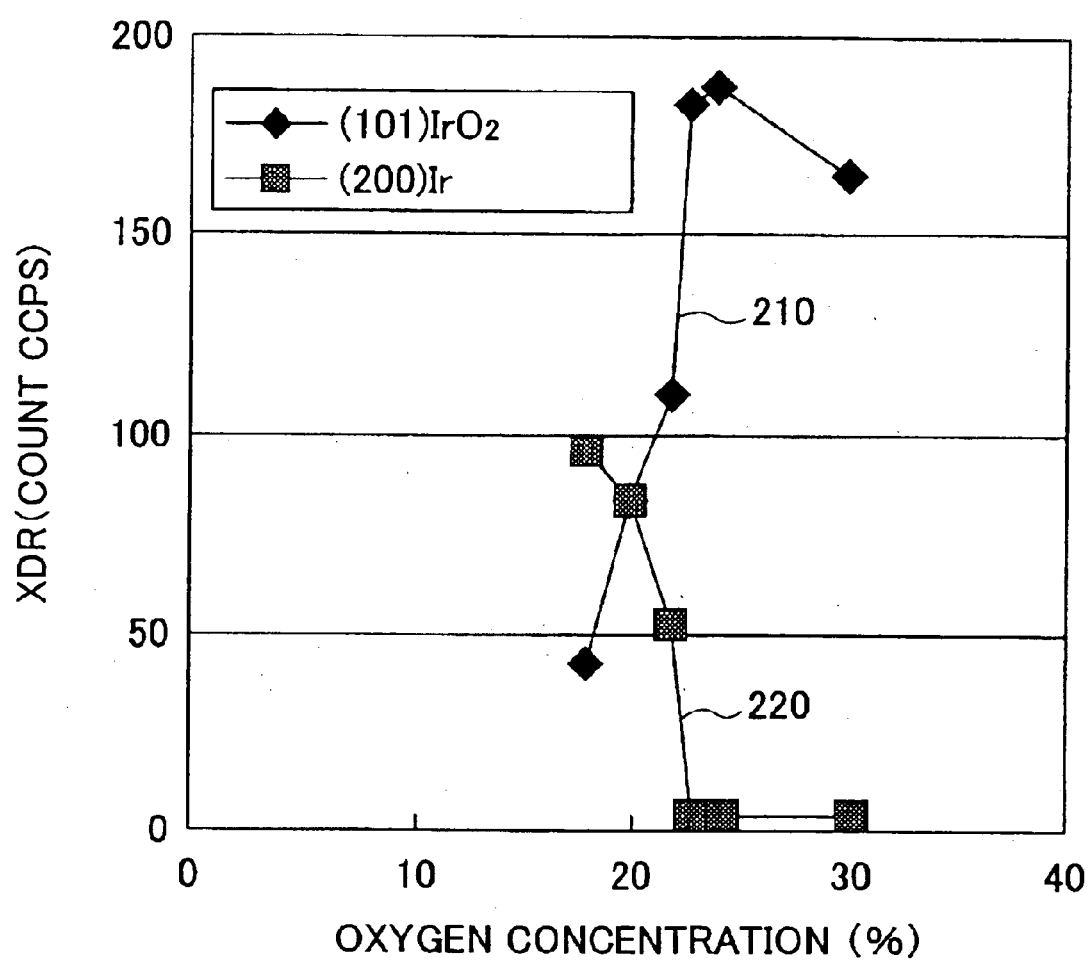
FIG. 2 is a diagram showing the relationship between a surface state of an iridium film and oxygen concentration in a process ambient obtained by using X-ray diffraction.

FIG. 2 shows the relationship between the surface state of the iridium oxide film 105 obtained by the X-ray diffraction analysis and the oxygen concentration in the process ambient, wherein the vertical axis represents the X-ray diffraction intensity represented in terms of count/second while the horizontal axis represents the oxygen concentration in the ambient represented in terms of %.

Referring to FIG. 2, the line 210 represents the intensity of the (101) diffraction peak of iridium oxide ($IrO_2$), while the line 220 represents the intensity of the (200) diffraction peak of metal iridium (Ir).

As can be seen in FIG. 2, the diffraction from the (101) surface of iridium oxide is predominant in the case the oxygen concentration in the ambient is set to 20% or more, indicating that oxidizing reaction is predominant on the surface of the iridium oxide film 105 under such a process condition.

In the case the oxygen concentration in the ambient is reduced below, 20%, on the other hand, it can be seen that the diffraction from the (101) surface of iridium oxide drops sharply and the diffraction from the (200) surface of Ir increases sharply. This indicates that a reducing reaction is predominant on the surface of the iridium oxide film 105 under this condition and that the surface of the iridium oxide film 105 is actually formed of a metal iridium-film.

The relationship of FIG. 2 indicates that there exists a critical point of oxidation-reduction reaction, in which the oxidizing reaction and the reducing reaction are equilibrated, at the oxygen concentration of about 20%.

In FIG. 2, it is remarkable that the transition of intensity of the (101) $IrO_2$ diffraction peak and the (200) Ir diffraction peak occurs very sharply and that the surface state of the sample 105 changes rapidly from iridium oxide to metal iridium when the oxygen concentration in the ambient has been reduced to 20%, or less.

This rapid change of the surface state of the iridium oxide/iridium film 105 is also evaluated by other means.

Figure 3:
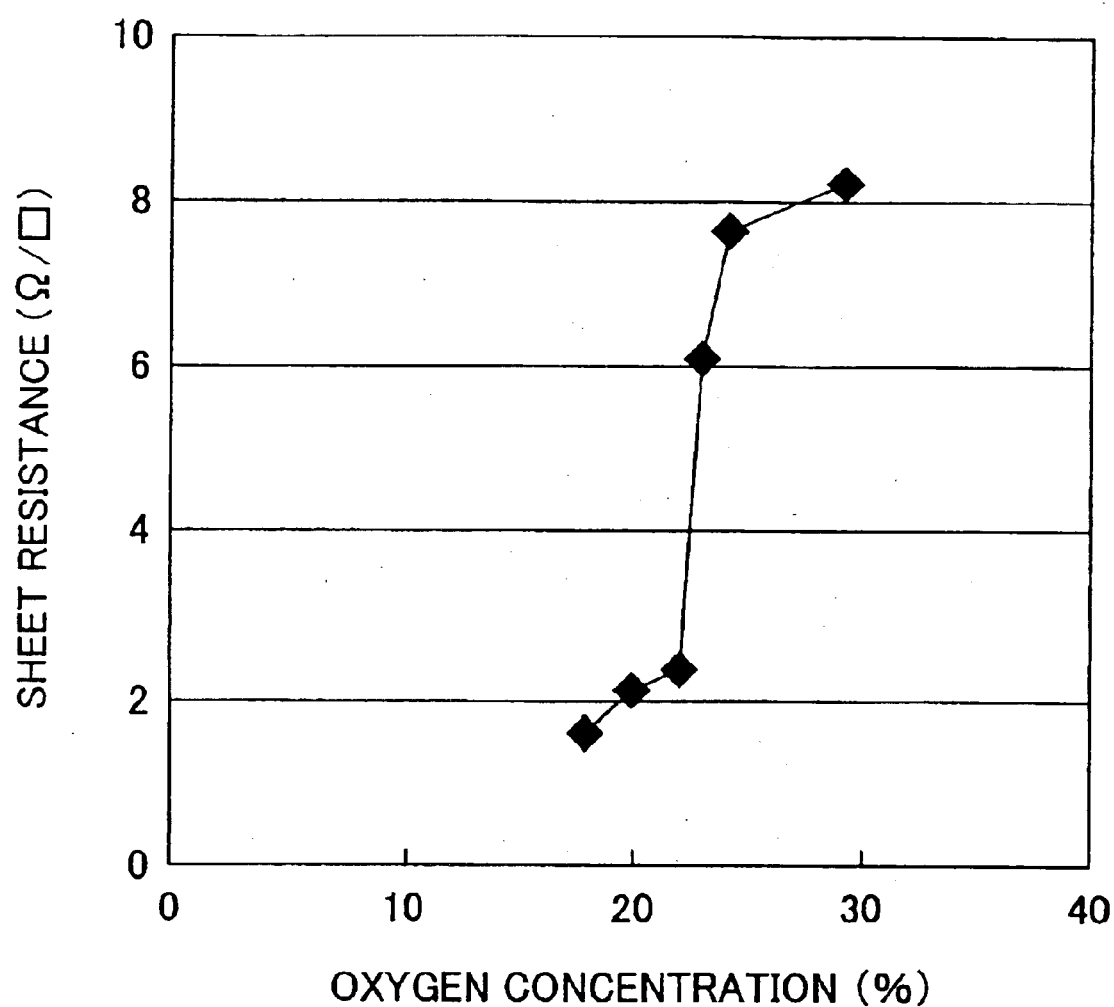
FIG. 3 is a diagram showing the relationship between a sheet resistance of an iridium film and oxygen concentration contained in the ambient.
Figure 4:
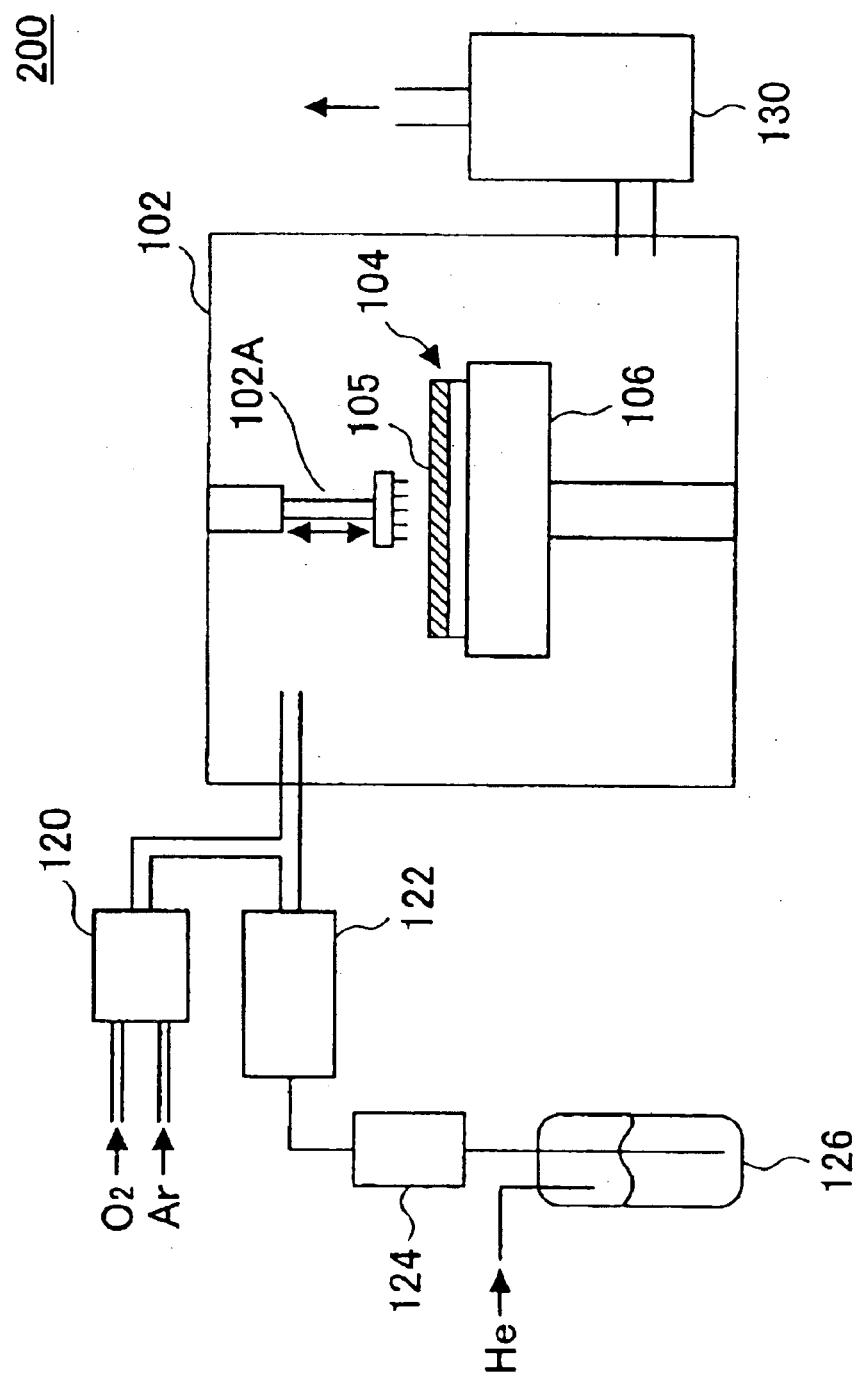
FIG. 4 is a diagram showing a modification of the apparatus of FIG. 1.

FIG. 3 shows the result of measurement of sheet resistance of the film 105 for the case the film 105 is processed in an apparatus 200 of FIG. 4 under various ambient, wherein it should be noted that the apparatus 200 has a construction substantially identical with that of the apparatus 100 except that there is provided a four-terminal probe 102A in the reactor 102 in a movable matter in a vertical direction such that the probe 102A makes a contact with the surface of the sample 104 in the position in which the probe 102A is fully lowered. In FIG. 4, those parts corresponding to the parts described previously are designated by the same reference numerals and the description thereof will be omitted.

Again, it can be seen from FIG. 3 that there is observed a sharp drop of, sheet resistance when the oxygen concentration in the ambient has been reduced to about 20% or less, indicating the existence of transition of the surface state of the film 105 from the oxide state to the metal state.

In FIGS. 2 and 3, it is clear that the reduction of the film 105 is caused by the vapor of the organic solvent 126 contained in the ambient, while the observed sharp change of the surface state suggests the existence of catalytic action caused by the metal state iridium.

Thus, by first "biasing" the process ambient to the reducing side by supplying the vapor of the organic solvent such that the metal surface of iridium is exposed and next by depositing a ferroelectric film such as a PZT film on such an iridium film under the existence of oxygen, it becomes possible to control the surface state of the iridium film to the critical point of the oxidation-reduction reaction at the initial phase of the deposition of the ferroelectric film, and it becomes possible to control the alignment of the crystal grains in the ferroelectric film in conformity with the crystal orientation of the metal state iridium film.

It should be noted that the organic solvent which can be used in the present invention for the reducing agent is not limited to THF or butyl acetate mentioned before, but other organic solvents such as n-octane, xylene, n-butyl acetate, tertiary butyl acetate, and the like can be used similarly.

Figure 5:
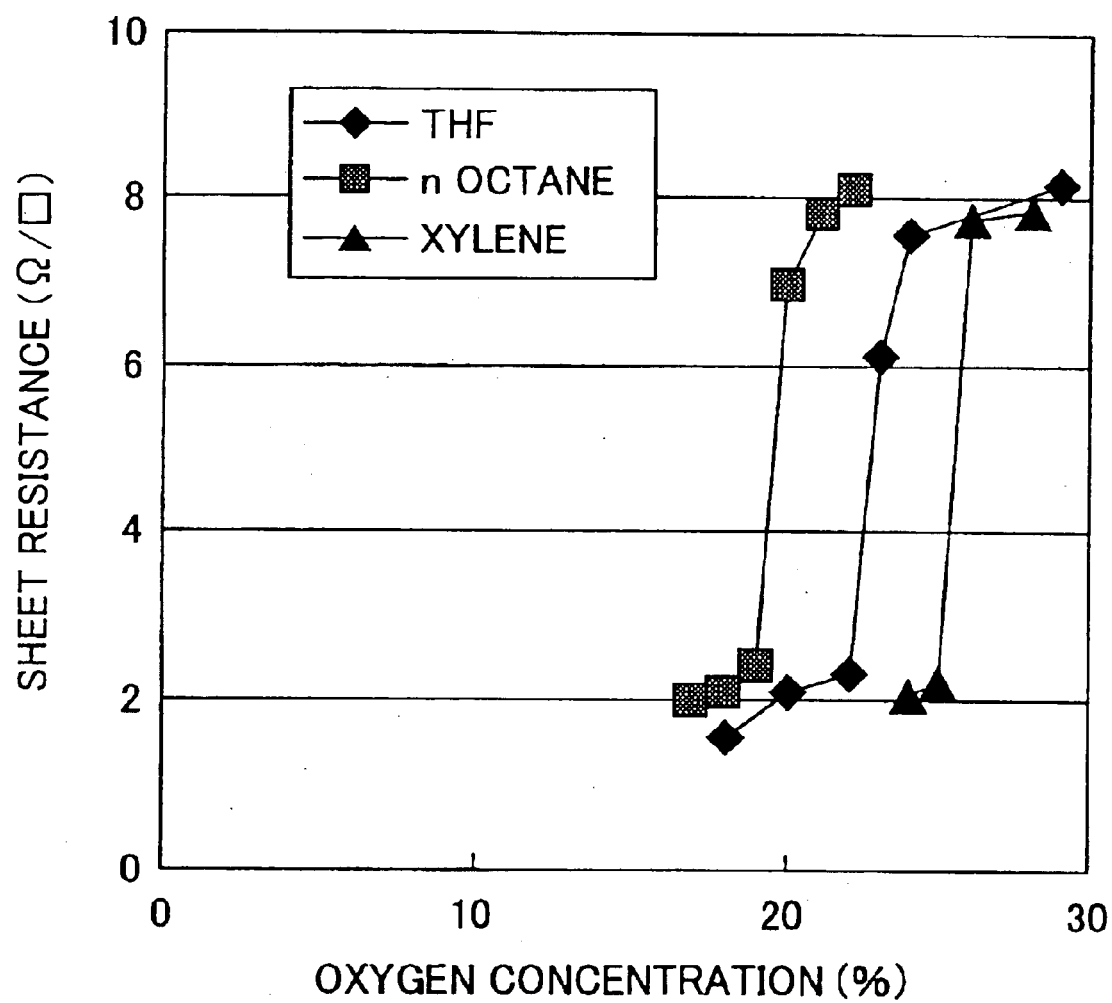
FIG. 5 is a diagram showing the relationship between a sheet resistance of an iridium film and oxygen concentration in a process ambient under existence of various organic solvents.

FIG. 5 compares the transition between the reduced state and oxidized state as represented in terms of the change of the sheet resistance for the case of using various organic solvents for the reducing agent.

Referring to FIG. 5, a similar sharp drop of sheet resistance is observed for all of the cases, wherein the concentration of oxygen in the ambient corresponding to the critical point is changed slightly case by case.

It can be seen-also in FIG. 5 that xylene is the strongest reducing agent among the group of THF, octane and xylene.

As noted before, the organic solvent that can be used for the reducing agent is not limited to those listed above. In view of the fact that an MOCVD process is conducted after the deposition of the iridium electrode film in the fabrication process of an FeRAM for depositing a ferroelectric film, it is preferable that the organic solvent is the one that can dissolve a metal organic source used in the MOCVD process for depositing the ferroelectric film.

It should be noted that the foregoing discovery of the catalytic action is not limited to iridium, and the control of the oxidation-reduction state of metal surface by supplying an oxidizing gas and a reducing gas simultaneously is effective also in the case of using other metal such as ruthenium (Ru) in place of iridium.

Second Embodiment

It should be noted that the surface state of a metal film can be conveniently measured by detecting optical reflectivity or gloss. When the surface state of the metal film is metallic, the metal film provides a large reflectivity, while when the metal film is oxidized, the reflectivity of the film is degraded.

Figure 6:
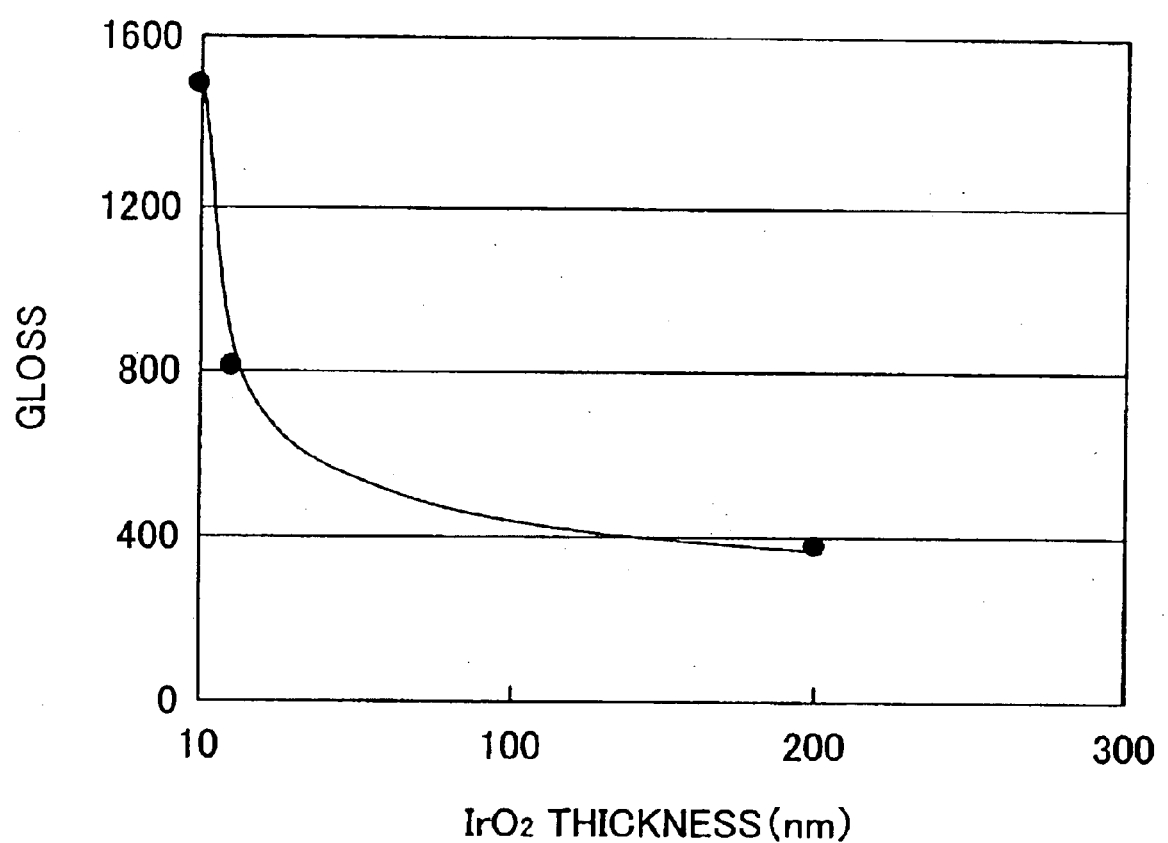
FIG. 6 is a diagram showing the relationship between a thickness of an iridium oxide layer formed on an iridium film and the reflectivity of the iridium film.

FIG. 6 shows the relationship between the gloss of an iridium film and the thickness of an iridium oxide film formed on the surface of the iridium film.

Referring to FIG. 6, it can be seen that the gloss of the iridium film decreases sharply with increase of film thickness of the iridium oxide film formed on the iridium film surface.

Figure 7:
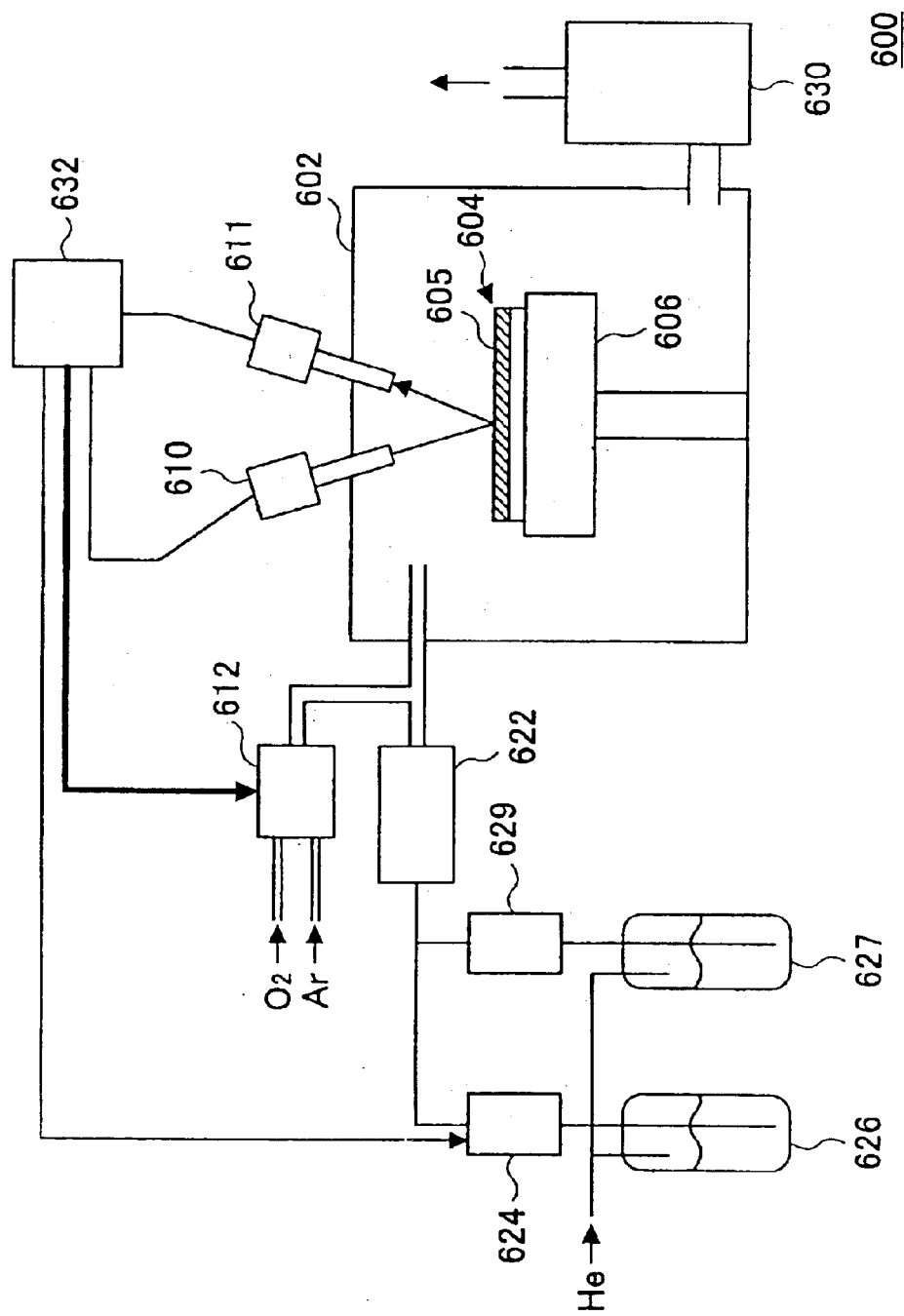
FIG. 7 is a diagram showing the construction of a film forming apparatus according to a second embodiment of the present invention for forming a ferroelectric film.

FIG. 7 shows the construction of a deposition apparatus 600 used for forming a ferroelectric film on the surface of a metal film such as an iridium film or ruthenium film according to a second embodiment of the present invention.

Referring to FIG. 7, the deposition apparatus 600 includes a reactor 602 defining a process space therein and a stage 606 is provided in the process space for holding a substrate 604 to be processed, wherein the stage 606 includes a heater for heating the substrate 604 to a predetermined substrate temperature.

The process space thus formed inside the reactor 602 is evacuated by a pump 630 to a predetermined process pressure, and a mixed gas of oxygen and argon is introduced into the process space via a gas mass-flow controller 612 under control of a controller 632.

Further, the deposition apparatus 600 includes a bottle 627 holding a metal organic source of a ferroelectric film to be formed, wherein the metal organic source in the bottle 627 is transported to a vaporizer 622 via a liquid mass-flow controller 629 and the vapor of the metal organic source formed in the vaporizer 622 is introduced into the process space inside the reactor 602. The vaporizer 622 causes evaporation of the organic material supplied thereto similarly to the case of the vaporizer 122 of FIG. 1.

Further, the deposition apparatus 600 includes a bottle 628 holding an organic solvent, and the organic solvent in the bottle 628 is transported to the vaporizer 622 via a liquid mass-flow controller 624 under control of the controller 632.

Further, the reactor 602 is provided with an optical source 610 and an optical detector 611 aligned such that the optical detector 611 detects the optical beam emitted by the optical source 610 and reflected by the substrate 604 on the stage 606, wherein the controller controls the gas mass-flow controller 612 and the liquid mass-flow controller 624 in response to the output of the optical detector 611.

In the case of depositing a PZT film on the substrate 604, there are actually provided plural bottles 627 for holding the metal organic sources of $Pb(thd)_2$, $Zr(thd)_2$ and $Ti(OiPr)_2(thd)_2$. It should be noted that thd represents tetramethylheptane dionate.

FIGS. 8A–8D show the process conducted by the deposition apparatus 600 of FIG. 7 when forming a PZT film on an iridium film.

Figure 8A:
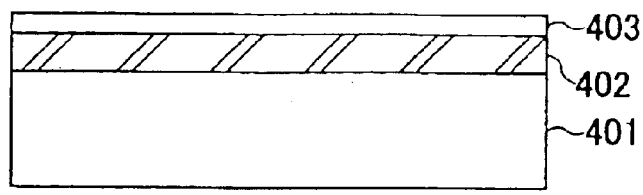
FIGS. 8A–8D are diagrams showing the process of forming a ferroelectric film on a metal film according to the second embodiment of the present invention.

Referring to FIG. 8A, a Si substrate 401 formed with a metal film 403 of iridium via an intervening silicon oxide 402 film is introduced into the reactor 602 in a step 1 as the substrate 604, and the substrate temperature is increased to a predetermined temperature, typically in the range of 500–600° C.

Figure 8B:
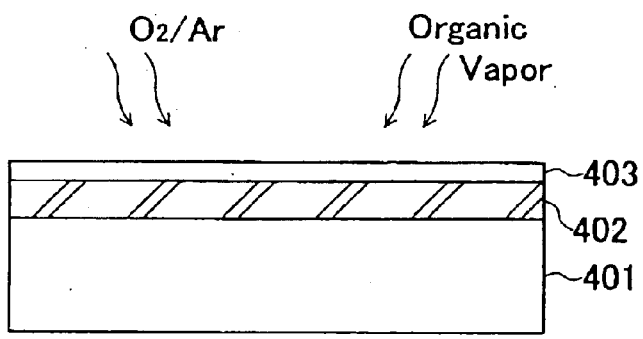

Next, in the step of FIG. 8B, the surface of the metal film 403 is processed by the oxygen/argon gas mixture from the gas mass-flow controller 612 and the vapor of the organic solvent from the liquid mess-flow controller 624.

Figure 8C:
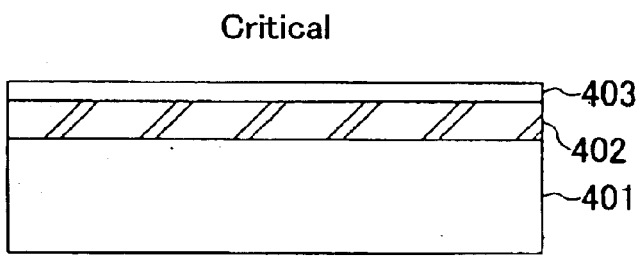

Next, in the step of FIG. 8C, the concentration of oxygen in the process space is controlled by the controller 632 by controlling the ratio of the oxidizing gas mixture from the gas mass-flow controller 612 to the vapor of the organic solvent from the vaporizer 622, such that there appears a critical point in which the oxidizing reaction and the reducing reaction are equilibrated on the surface of the metal film 403.

Figure 8D:
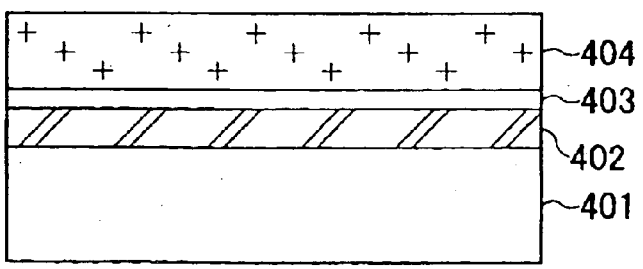

Next, in the step of FIG. 8D, the metal organic source in the bottle 627 is introduced into the process space in the reactor 602 and deposition of a desired PZT film 404 is achieved.

At the beginning of the step of FIG. 8D, it should be noted that the metal state surface of the iridium film 403 is exposed at least partially because of the controlled oxidation state of the surface. Further, the $IrO_2$ film existing on the surface of the iridium film 403 has a thickness of merely several atomic layers.

Thus, the ferroelectric film 404 deposited on the iridium film 403 inherits the crystal orientation and the crystal grains in the ferroelectric film 404 generally take the <001> alignment. Thereby, the ferroelectric film 404 grown further on such an initial ferroelectric film inherits the foregoing initial alignment, and the ferroelectric film 404 as a whole is crystallized with the <001> orientation.

By forming an upper electrode layer on the ferroelectric film 404 in the state of FIG. 8D, a ferroelectric capacitor is formed.

In order that the preferred control of the crystal grain orientation is achieved, therefore, it is extremely important to control the surface state of the iridium film 403 such that the oxygen atoms existing on the iridium film 403 does not exceed several atomic layers. Otherwise, the crystal orientation of the ferroelectric film 404 does not inherit the crystal orientation of the iridium film 403 and the desired <001> orientation of the ferroelectric film will be lost.

Figure 9:
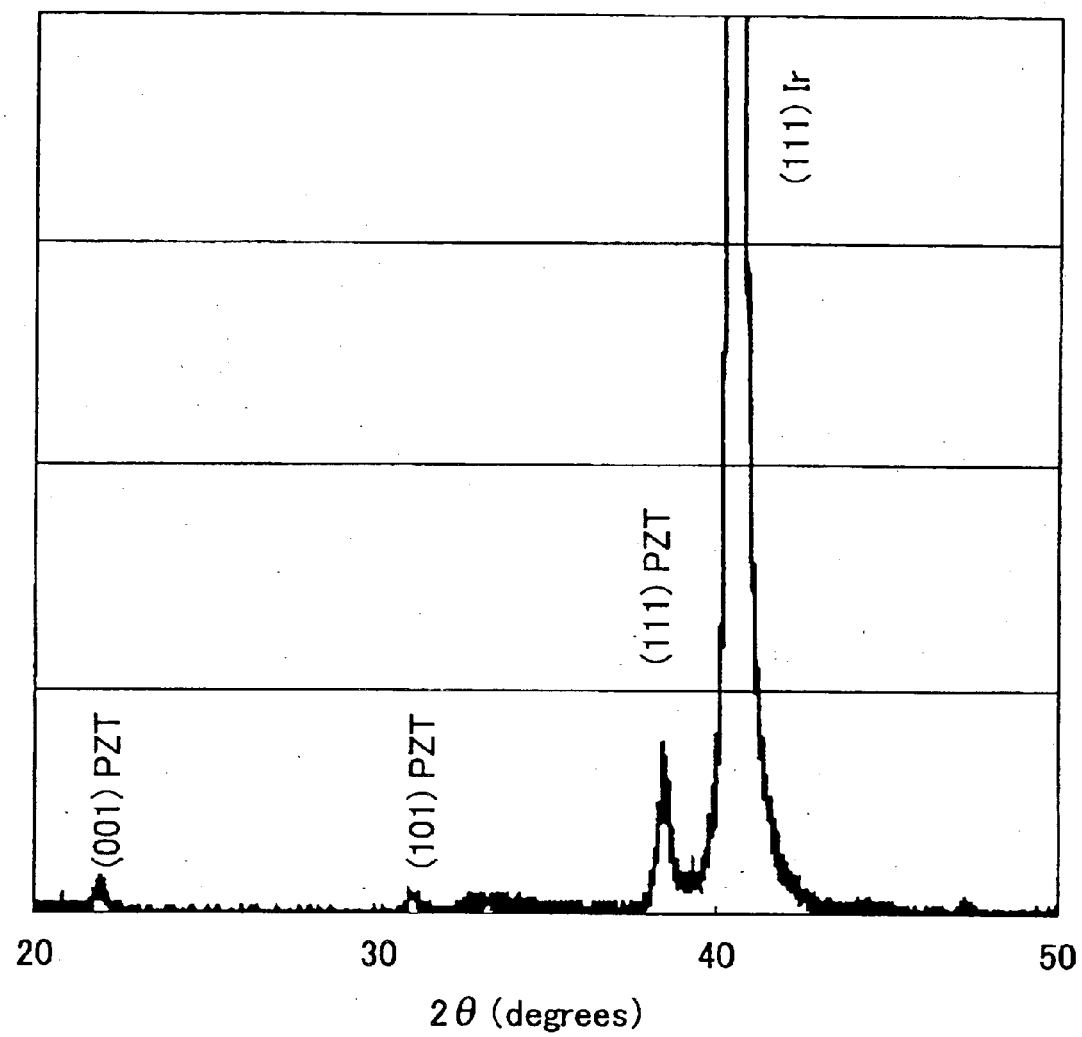
FIG. 9 is a diagram showing the X-ray diffraction pattern of a PZT film for the case the PZT film is grown on an oxidized surface of an iridium film.
Figure 10:
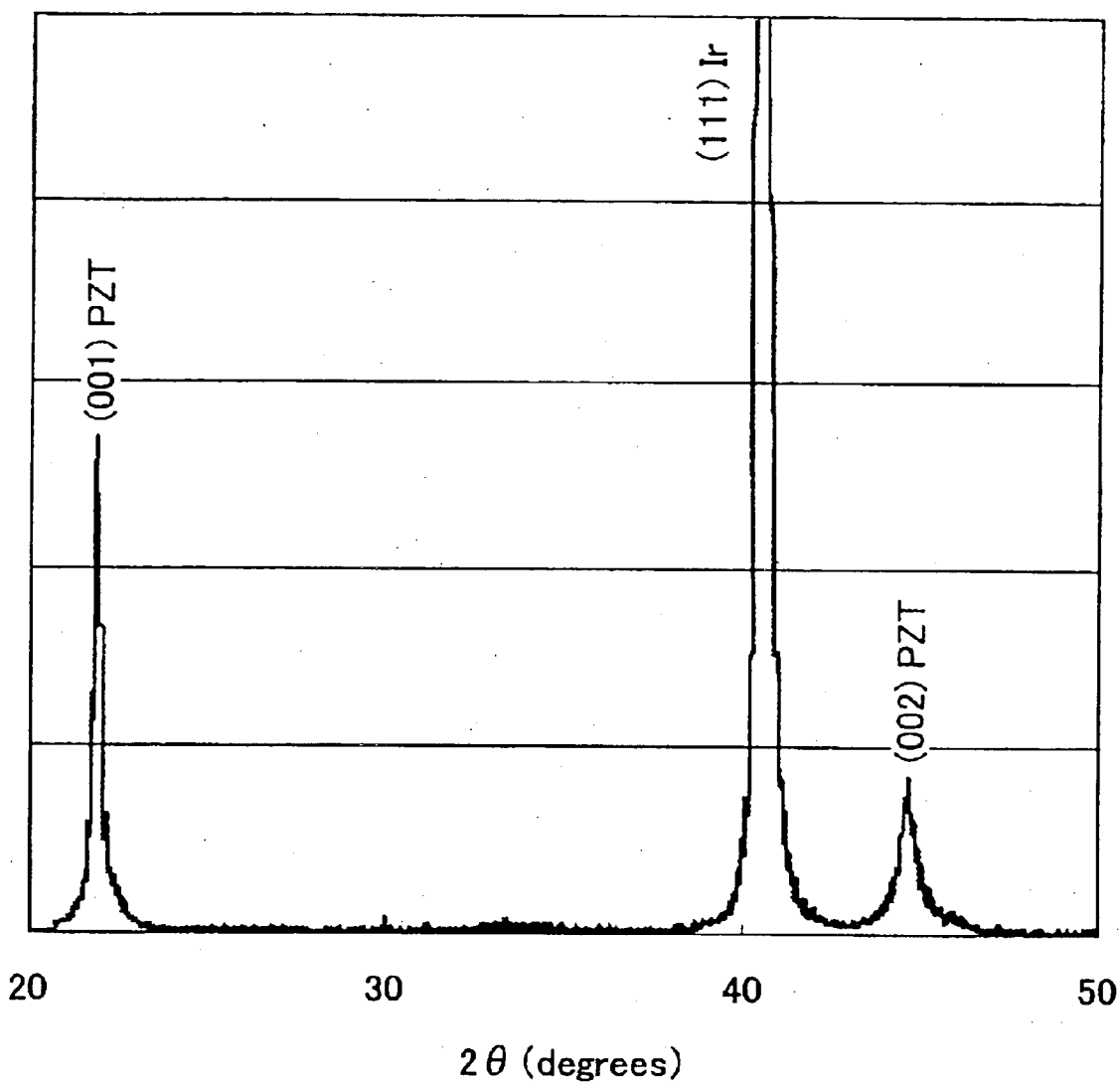
FIG. 10 is a diagram showing the x-ray diffraction pattern of a PZT film for the case the PZT film is grown on a surface of an iridium film having a controlled oxidation state.

FIG. 9 shows the X-ray diffraction pattern of the PZT film 404 formed on the iridium film 403 in the state that the surface of the iridium film 403 is completely oxidized, while FIG. 10 shows the X-ray diffraction pattern of the PZT film 404 for the case the surface state of the iridium film 403 is controlled to the critical state.

Referring to FIGS. 9 and 10, it can be seen that a strong peak corresponding to the (001) plane of PZT is observed in the case of FIG. 10, indicating that the PZT film 404 formed on the iridium film 403 is. indeed aligned in the <001> orientation.

In the case of FIG. 9, on the other hand, it can be seen that the height of the (001) diffraction peak is reduced substantially and the (100) diffraction peak has generally the same height as that of the (001) diffraction peak. This means that the PZT crystal grains of the <100> orientation exist in the PZT film 404 with generally the same amount with the PZT crystal grains of the <001> orientation. In view of the fact that a PZT crystal oriented in the <100> direction does not show ferroelectricity to the electric field applied in the <001> direction, the existence of crystal grains of the <100> orientation means that the ferroelectric film performs very poorly when used in an FeRAM in which the electric field is applied perpendicularly to the plane of the ferroelectric film. In FIG. 9, the diffraction peak from the (111) plane represents the diffraction from a PZT crystal grain obliquely aligned. While the crystal orientation is useful, the ferroelectricity of a PZT crystal does not become maximum with this crystal orientation.

In the case of the present invention, the crystal grains in the PZT film 404 are uniformly oriented in the <001> direction as demonstrated in FIG. 10. No diffraction from the (100) plane or (111) plane is observed. Because a PZT crystal shows maximum ferroelectricity to the electric-field applied in the <001> direction, the PZT film 404 of FIG. 10 is ideal for use in an FeRAM.

In the case of depositing an SBT ($SrBi_2Ta_2O_9$) film, metal organic sources of $Sr[Ta(OEt)_6]_2$ and $Biph_3$ are held in the respective source bottles 627 in the deposition apparatus of FIG. 7.

Third Embodiment

FIGS. 11A–11D show a process conducted by the deposition apparatus 600 of FIG. 7 when forming a PZT film on an iridium film according to a third embodiment of the present invention, wherein those parts corresponding to the parts described previously are designated by the same reference numerals and the description thereof will be omitted.

Figure 11A:
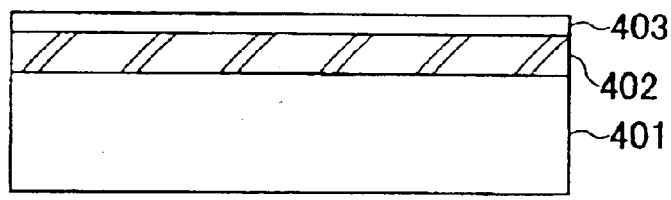
FIGS. 11A–11D are diagrams showing the process of forming a ferroelectric film according to a third embodiment of the present invention.

Referring to FIG. 11A, this process corresponds to the process of FIG. 8A and the metal film 403 of iridium is formed on the silicon oxide film 402, which is turn is formed on the silicon substrate 604. Further, the substrate temperature is increased to a predetermined temperature, typically in the range of 500–600° C.

Figure 11B:
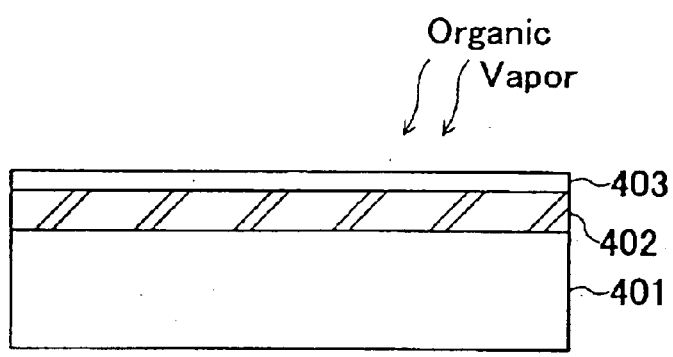

Next, in the step of FIG. 11B, the surface of the metal film 403 is processed by the vapor of the organic solvent from the liquid mess-flow controller 624. As a result, the surface state of the metal film 403 is biased strongly to the reducing side.

Figure 11C:
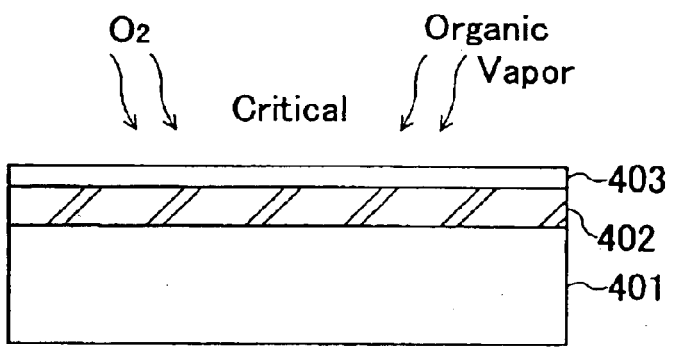

Next, in the step of FIG. 11C, the metal organic source of the ferroelectric film in the bottle 627 is introduced into the processing vessel 602 together with oxygen, which is used to decompose the metal organic source. As a result, there is caused an oxidation reaction simultaneously with a reducing reaction on the surface of the iridium film 403, and there appears a critical point of the oxidation-reduction reaction in which the oxidation reaction and the reducing reaction are equilibrated by controlling the flow rate of the oxygen gas by the controller 632 by way of driving the mass-flow controller 612.

Figure 11D:
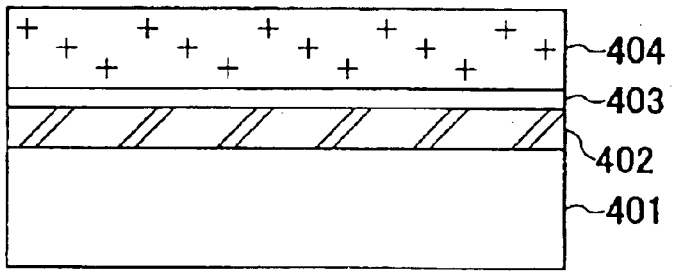

Next, in the step of FIG. 11D, the metal organic source in the bottle 627 is introduced further into the process space in the reactor 602 and deposition of a desired PZT film 404 is achieved.

In this case, the metal state surface of the iridium film 403 is exposed at least partially because of the controlled oxidation state of the surface at the beginning of the step of FIG. 11C. Further, the $IrO_2$ film existing on the surface of the iridium film 403 has a thickness of merely several atomic layers.

Thus, the ferroelectric film 404 deposited on the iridium film 403 in the step of FIG. 11D inherits the crystal orientation and the crystal grains in the ferroelectric film 404 generally take the <001> alignment. Thereby, the ferroelectric film 404 grown further on such an initial ferroelectric film inherits the foregoing initial alignment, and the ferroelectric film 404 as a whole is crystallized with the <001> orientation.

By forming an upper electrode layer on the ferroelectric film 404 in the state of FIG. 8D, a ferroelectric capacitor is formed.

In order that the preferred control of the crystal grain orientation is achieved, therefore, it is extremely important to control the surface state of the iridium film 403 such that the oxygen atoms existing on the iridium film 403 does not exceed several atomic layers. Otherwise, the crystal orientation of the ferroelectric film 404 does not inherit the crystal orientation of the iridium film 403 and the desired <001> orientation of the ferroelectric film will be lost.

Fourth Embodiment

Next, the fabrication process of an FeRAM according to a fourth embodiment of the present invention will be described with reference to FIGS. 12A–12E.

Figure 12A:
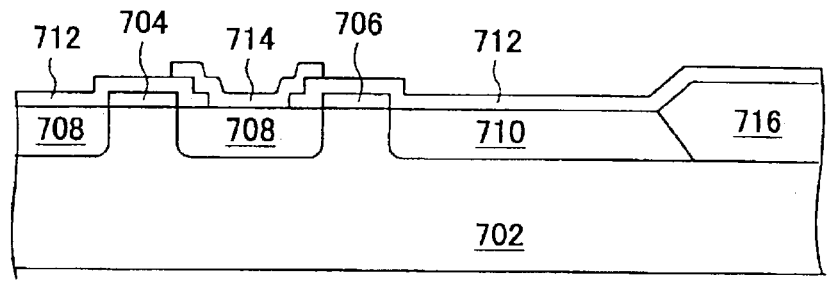
FIGS. 12A–12E are diagrams showing the fabrication process of a semiconductor device according to a third embodiment of the present invention.

In the step of FIG. 12A, a semiconductor structure is formed on a silicon substrate 702 wherein it will be noted that the silicon substrate 702 includes a device region defined by a device isolation film 716, and gate electrodes 704 and 706 are formed on the substrate 702 so as to extend over the device region with an intervening gate insulation film (not illustrated). Further, diffusion regions 708 and 710 are formed in the substrate 702 in correspondence to the device region at both lateral sides of the gate electrodes 704 and 706.

The surface of the silicon substrate 702 is covered with an oxide film 712 including the gate electrodes 704 and 706, and a bit line electrode 714 is provided on the oxide film 712 via a contact opening formed in correspondence to the diffusion region 708.

Figure 12B:
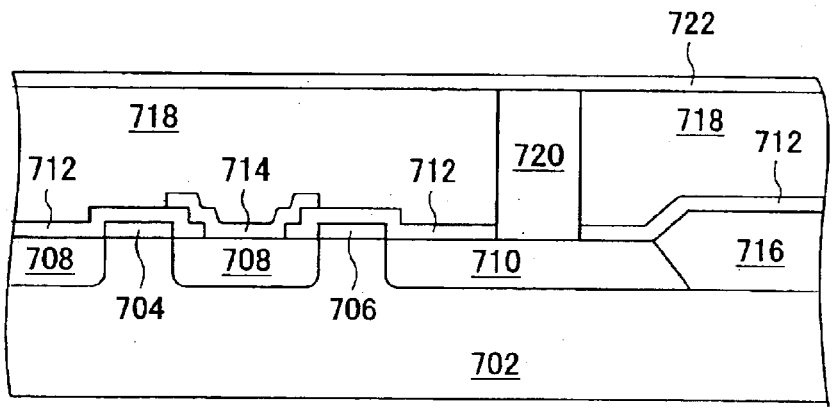

In the step of FIG. 12B, the structure of FIG. 12A is covered with an interlayer insulation film 718, wherein a contact hole is formed in the interlayer insulation film 718 so as to expose the diffusion region 710, and a contact plug 720 is formed in the contact hole in electrical connection with the diffusion region 710. The contact plug 720 may be formed of a conductive material such as tungsten (W).

In the step of FIG. 12B, it should be noted that the surface of the interlayer insulation film 718 is planarized by a CMP (chemical mechanical polishing) process, and a conductor layer 722 containing iridium is formed on the interlayer insulation film 718 uniformly by a spurting process, and the like. It should be noted that the conductor layer 722 is used as a lower capacitor electrode of a ferroelectric capacitor in the FeRAM of the present embodiment as will be explained later.

The conductor layer 722 may have a laminated structure in which an $IrO_2$ layer having a thickness of 100 nm is sandwiched by a pair of Ir layers each having a thickness of 50 nm. While conductor layer 722 is not limited to the one having the foregoing laminated structure, it is preferable in the present invention to use a metal layer that shows catalytic action in the metal state such as iridium or ruthenium for the uppermost layer of the conductor layer 722.

Figure 12C:
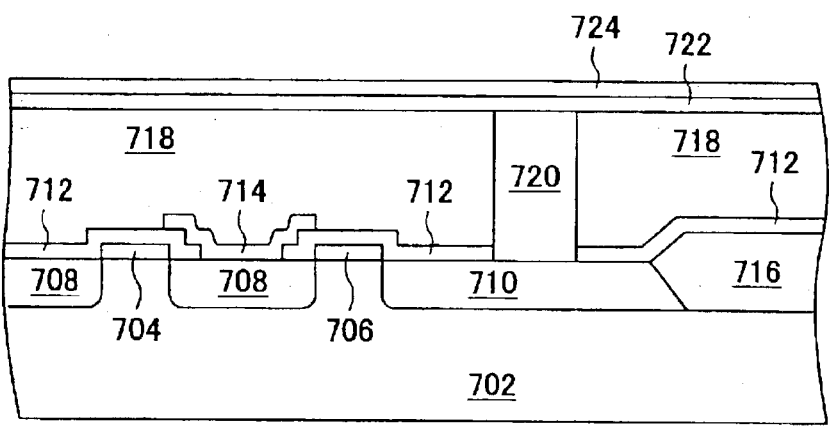
Figure 12D:
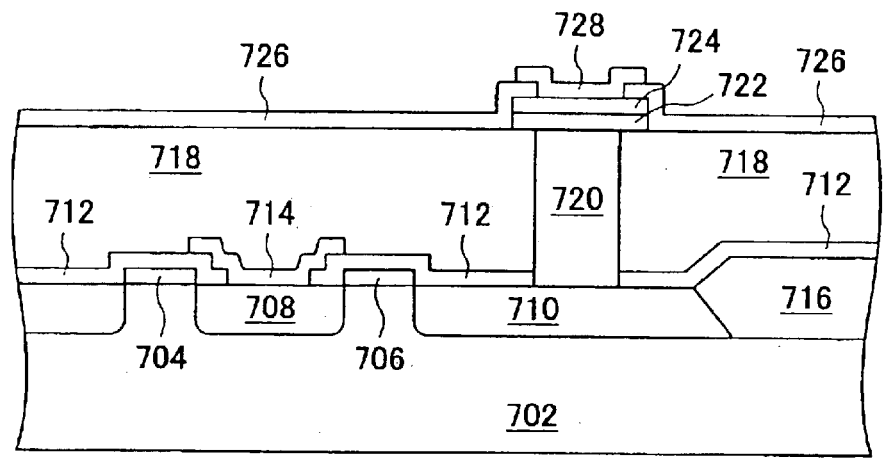

In the step of FIG. 12C, the structure of FIG. 12B is introduced into the reactor 602 of FIG. 7 and the surface state of the conductor layer 722 is controlled to the foregoing critical point.

While controlling the surface state to the foregoing critical point, deposition of a ferroelectric film such as a PZT film 724 is started by supplying the metal organic sources of PZT noted before. Thereby, the PZT crystals grown at the surface of the iridium film 722 are aligned in the <001> direction because of the preparation of the surface state to the foregoing critical point, and the continuous deposition of the PZT film 724 results in a crystal orientation of the <001> direction for the entire film of the PZT film 724.

After formation of the PZT film 724 achieved as such, the PZT film 724 and the underlying iridium film 722 are patterned, and an oxide film 726 is provided on the interlayer insulation film 718 so as to cover the laminated pattern of the iridium film 722 and the PZT film 724. Further, the oxide film 726 is. patterned in the step of FIG. 12D to form an opening exposing the PZT film 724 in the laminated pattern, and an upper electrode such as Pt is provided on the oxide film 726 in electrical contact with the PZT film 724.

Figure 12E:
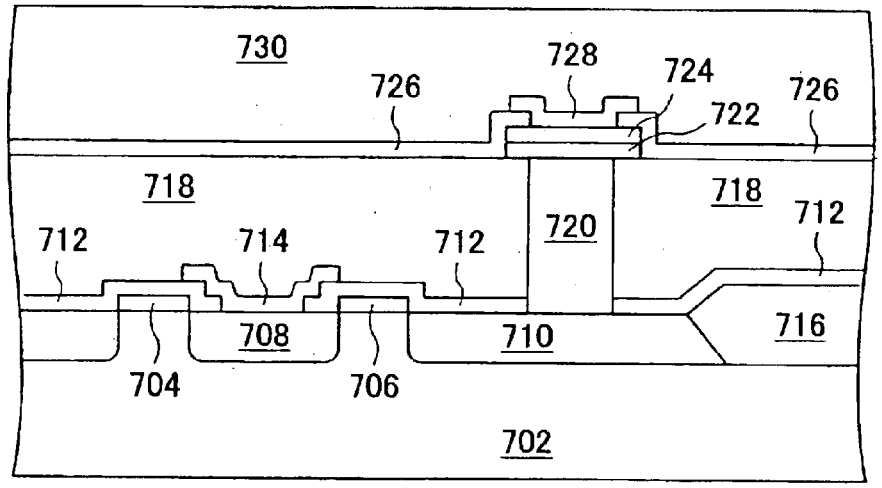

Thereafter, in the step of FIG. 12E, the structure of FIG. 12E is covered with an interlayer insulation film 730 and wiring patterns (not shown) are formed on the interlayer insulation film as necessary.

In the FeRAM thus formed, it should be noted that the PZT film 724 formed by an MOCVD process is aligned in the desired direction of <001> and maximum ferroelectricity can be achieved.

As a result, the FeRAM of the present invention can be written with information with minimum drive voltage.

As noted previously, the present invention is by no means limited to the material system of PZT film formed on an iridium film. Thus, it is possible to use a film of ruthenium in place of the iridium film. Further, it is possible to use an SBT film for the ferroelectric film.

Further, the control of oxygen concentration in the process space is not limited to the one explained before in which the supply rate of the oxidizing gas is changed while maintaining the supply rate of the organic solvent to constant but it is also possible to change the supply rate of the organic solvent while maintaining a constant supply rate of the oxidizing gas. All what is needed is to change the balance of supply rate of the oxidizing gas and the reducing gas as desired. It is preferable, however, to change the supply rate of the oxidizing gas while maintaining a constant supply rate of the organic solvent in view of fact that the temperature control of the vaporizer, which would become necessary in the case the supply rate of the organic solvent is changed, can be eliminated.

Further, the present invention is not limited to the embodiments described heretofore, but various variations and modifications may be made without departing from the scope of the present invention.

What is claimed is

1. A method of realizing a critical state of oxidation-reduction reaction on the surface of a layer that takes a metal state in a reducing ambient and an oxide state in an oxidizing ambient and shows a catalytic action in the metal state, comprising the steps of:

introducing said layer into a process space;

supplying an oxidizing gas and a vapor of an organic solvent into said process space; and causing an oxidizing reaction and a reducing reaction on said surface of said layer in said process space, said oxidizing gas and said vapor being supplied into said furnace with a proportion set such that there is caused an equilibrium between an oxidation reaction caused by said oxidizing gas and a reducing reaction caused by said vapor on said surface of said layer.

2. A method of determining the state of an oxidation-reduction reaction taking place on a layer of a material that takes a metal state in a reducing ambient and an oxide state in an oxidizing ambient, said material showing a catalytic action in said metal state, said method comprising the steps of:

introducing said layer into a process space;

supplying an oxidizing gas and a vapor of an organic solvent into said process space;

causing an oxidizing reaction and a reducing reaction on said surface of said layer in said process space;

examining a state of said surface of said layer; and determining a ratio of said oxidizing gas and said reducing gas that provides an equilibrium condition in which an oxidizing reaction and a reducing reaction equilibrate.

3. An apparatus for forming a ferroelectric film, comprising:

a reactor evacuated by a pump;

a stage provided in said reactor for holding a substrate;

a first source supplying an oxidizing gas to said reactor;

a second source supplying a reducing gas to said reactor;

a third source supplying a gaseous source material of said ferroelectric film to said reactor;

a detector detecting an oxide film formed on said substrate on said stage; and a controller controlling said first through third sources, said controller controlling said first and second sources in response to an output of said detector such that there is realized a critical state of oxidation-reduction reaction taking place on a surface of said substrate, said detector determining the state of an oxidation-reduction reaction taking place on a layer of a material that takes a metal state in a reducing ambient and an oxide state in an oxidizing ambient according to the method as claimed in claim 2.

* * * * *